United States Patent
Neil et al.

(10) Patent No.: US 10,032,498 B2
(45) Date of Patent: Jul. 24, 2018

(54) MEMORY CELL UNIT AND RECURRENT NEURAL NETWORK INCLUDING MULTIPLE MEMORY CELL UNITS

(71) Applicants: SAMSUNG ELECTRONICS CO., LTD., Suwon-si (KR); UNIVERSITAET ZUERICH, Zurich (CH)

(72) Inventors: Daniel Neil, Zurich (CH); Shih-Chii Liu, Zurich (CH); Michael Pfeiffer, Zurich (CH)

(73) Assignees: SAMSUNG ELECTRONICS CO., LTD., Suwon-si (KR); UNIVERSITAET ZUERICH, Zurich (CH)

( * ) Notice: Subject to any disclaimer, the term of this patent is extended or adjusted under 35 U.S.C. 154(b) by 0 days.

(21) Appl. No.: 15/347,501

(22) Filed: Nov. 9, 2016

(65) Prior Publication Data

US 2018/0005676 A1    Jan. 4, 2018

(30) Foreign Application Priority Data

Jun. 30, 2016   (KR) .................. 10-2016-0082556

(51) Int. Cl.
   *G11C 7/00*   (2006.01)
   *G11C 7/22*   (2006.01)
   *G06N 3/08*   (2006.01)

(52) U.S. Cl.
   CPC ............ *G11C 7/222* (2013.01); *G06N 3/08* (2013.01)

(58) Field of Classification Search
   CPC ............ G11C 7/222; G10L 25/30; G06N 3/08
   USPC ................ 365/193; 706/12, 25, 22; 704/232
   See application file for complete search history.

(56) References Cited

U.S. PATENT DOCUMENTS

| | | |
|---|---|---|
| 5,224,066 A | 6/1993 | Jourjine |
| 7,373,333 B2 | 5/2008 | Ito et al. |
| 7,877,338 B2 | 1/2011 | Tani et al. |
| 9,263,036 B1 * | 2/2016 | Graves .............. G10L 15/16 |
| 9,678,664 B2 * | 6/2017 | Zhai ................. G06F 3/0219 |
| 9,767,557 B1 * | 9/2017 | Gulsun .............. G06T 7/0012 |
| 2015/0170640 A1 | 6/2015 | Sak et al. |
| 2015/0215871 A1 | 7/2015 | Schillings et al. |
| 2016/0005391 A1 | 1/2016 | Agiomyrgiannakis et al. |
| 2016/0034812 A1 | 2/2016 | Gibson et al. |
| 2016/0098632 A1 | 4/2016 | Sutskever et al. |
| 2016/0099010 A1 | 4/2016 | Sainath et al. |
| 2016/0111108 A1 | 4/2016 | Erdogan et al. |
| 2016/0140434 A1 | 5/2016 | Yilmaz et al. |
| 2016/0140435 A1 | 5/2016 | Bengio et al. |
| 2016/0196488 A1 * | 7/2016 | Ahn .................... G06N 3/049 706/41 |

OTHER PUBLICATIONS

Daniel Neil et al; "Phased LSTM: Accelerating Recurrent Network Training for Long or Event-based Sequences"; Proc. of NIPS; 2016; 9 pgs. total.

* cited by examiner

*Primary Examiner* — Connie Yoha
(74) *Attorney, Agent, or Firm* — Sughrue Mion, PLLC

(57) ABSTRACT

A memory cell unit and a recurrent neural network including memory cell units are provided. The memory cell unit includes a first time gate configured to control a cell state value of the memory cell unit, based on a phase signal of an oscillatory frequency, and a second time gate configured to control an output value of the memory cell unit, based on the phase signal.

21 Claims, 11 Drawing Sheets

-- Prior Art --

MEMORY CELL UNIT AND RECURRENT NEURAL NETWORK INCLUDING MULTIPLE MEMORY CELL UNITS

CROSS-REFERENCE TO RELATED APPLICATION

This application claims priority from Korean Patent Application No. 10-2016-0082556, filed on Jun. 30, 2016 in the Korean Intellectual Property Office, the disclosure of which is incorporated herein by reference in its entirety.

BACKGROUND

1. Field

Methods and apparatuses consistent with example embodiments relate to a memory cell unit and a recurrent neural network (RNN) including memory cell units.

2. Description of the Related Art

Deep neural networks (DNNs) have been a dominant model for solving challenging issues in benchmarks of machine learning. Recurrent neural networks (RNNs) are a type of DNNs and may be implemented, for example, by training databases, computing resources or training algorithms.

RNNs include feedback connections, which may change states over time in response to inputs. Thus, RNNs may be used to analyze patterns in a time-evolving system.

SUMMARY

Example embodiments may address at least the above problems and/or disadvantages and other disadvantages not described above. Also, the example embodiments are not required to overcome the disadvantages described above, and an example embodiment may not overcome any of the problems described above.

According to an aspect of an example embodiment, there is provided a memory cell unit including a first time gate configured to control a cell state value of the memory cell unit, based on a phase signal of an oscillatory frequency, and a second time gate configured to control an output value of the memory cell unit, based on the phase signal.

The phase signal may have an open phase including a rising phase in which the phase signal changes from a first state to a second state, and a falling phase in which the phase signal changes from the second state to the first state, and a closed phase in which the first state of the phase signal is maintained.

The first time gate may be further configured to update the cell state value, based on an input value of the memory cell unit, in response to the phase signal being in the open phase, and maintain the cell state value regardless of the input value in response to the phase signal being in the closed phase.

The second time gate may be further configured to update the output value in response to the phase signal being in the open phase.

The phase signal may include a shaped pulse corresponding to a fraction of an oscillation period of the oscillatory frequency.

The first time gate and the second time gate may be further configured to open and close based on any one or any combination of an oscillation period of the oscillatory frequency, a ratio of a duration of an open phase to the oscillation period, and a phase shift in the oscillatory frequency, the open phase including a rising phase in which the phase signal changes from a first state to a second state, and a falling phase in which the phase signal changes from the second state to the first state.

The first time gate and the second time gate may be further configured to open and close based on independent oscillations in a respective one of the first time gate and the second time gate, the independent oscillations being specified by any one or any combination of the oscillation period, the ratio of the duration of the open phase to the oscillation period, and the phase shift.

The oscillation period, the ratio of the duration of the open phase to the oscillation period, and the phase shift may be trained in advance.

The memory cell unit may be configured to be selectively updated based on input values of the memory cell unit that are asynchronously sampled.

The memory cell unit may further include an input gate configured to determine a degree to which an input value of the memory cell unit is reflected, a forget gate configured to determine a degree to which the cell state value is forgotten. The first time gate may be further configured to determine, based on the phase signal, whether the cell state value is to be maintained or updated based on the determined degree to which the input value is reflected and the determined degree to which the cell state value is forgotten. The memory cell unit may further include an output gate configured to determine a degree to which the cell state value is output, based on the determination of whether the cell state value is to be maintained or updated. The second time gate may be further configured to determine, based on the phase signal, whether the output value is to be maintained or updated based on the determined degree to which the cell state value is output.

The first time gate may be further configured to update the cell state value, based on the input value and a second cell state value that is controlled by a gating function of the forget gate.

The first time gate and the second time gate may be configured to open and close based on an oscillation that is parameterized by parameters.

According to an aspect of another example embodiment, there is provided a recurrent neural network (RNN) including an input layer, a hidden layer including memory cell units, each of the memory cell units including a first time gate configured to control a cell state value of a respective one of the memory cell units, based on a phase signal of an oscillatory frequency, and a second time gate configured to control an output value of the respective one of the memory cell units, based on the phase signal, and an output layer.

The RNN may be configured to receive input values that are sampled from a continuous input signal.

The first time gate and the second time gate may be configured to open and close based on different oscillation frequencies or a same oscillation frequency.

The RNN may be configured to receive input values with different sampling rates, and each of phase signals corresponding to the input values may include different open phases corresponding to the different sampling rates.

The phase signal may have an open phase including a rising phase in which a phase signal changes from a first state to a second state, and a falling phase in which the phase signal changes from the second state to the first state, and a closed phase in which the first state of the phase signal is maintained.

The first time gate may be further configured to update the cell state value, based on an input value of the respective one of the memory cell units, in response to the phase signal being in the open phase, and maintain the cell state value regardless of the input value in response to the phase signal being in the closed phase.

The second time gate may be further configured to update the output value in response to the phase signal being in the open phase.

The phase signal may include a shaped pulse corresponding to a fraction of an oscillation period of the oscillatory frequency, and the first time gate and the second time gate may be further configured to open and close based on any one or any combination of an oscillation period of the oscillatory frequency, a ratio of a duration of an open phase to the oscillation period, and a phase shift in the oscillatory frequency, the open phase including a rising phase in which the phase signal changes from a first state to a second state, and a falling phase in which the phase signal changes from the second state to the first state.

According to an aspect of another example embodiment, there is provided a memory cell unit including an input gate configured to determine a degree to which an input value of the memory cell unit is reflected, a first memory configured to store a first cell state value of the memory cell unit, a forget gate configured to determine a degree to which the first cell state value of the memory cell unit is forgotten, a second memory configured to store a second cell state value of the memory cell unit, based on the determined degree to which the input value is reflected and the determined degree to which the first cell state value is forgotten, a first time gate configured to maintain the first cell state value, and update the first cell state value to be the second cell state value, based on a phase signal, an output gate configured to determine a degree to which the first cell state value is output, and a second time gate configured to, based on the phase signal, maintain an output value of the memory cell unit, and update, based on the first cell state value and the determined degree to which the first cell state value is output, the output value.

BRIEF DESCRIPTION OF THE DRAWINGS

The above and other aspects of example embodiments will become apparent and more readily appreciated from the following detailed description of certain example embodiments, taken in conjunction with the accompanying drawings of which.

DETAILED DESCRIPTION

Figure 1:
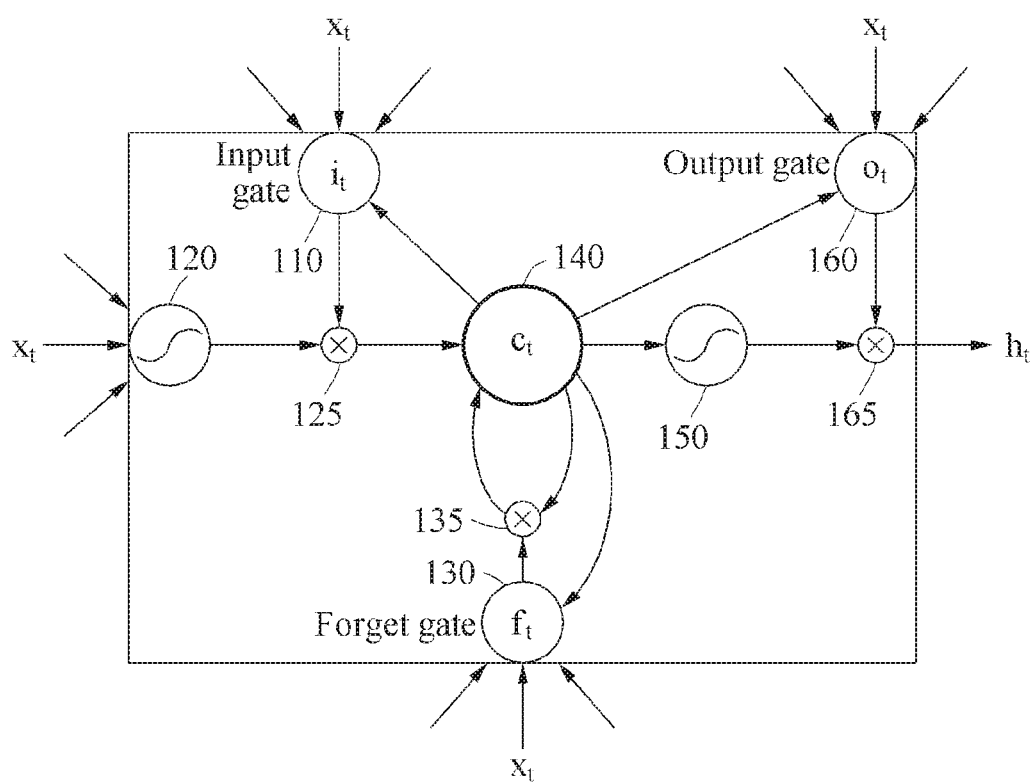
FIG. 1 is a diagram illustrating an architecture of a standard long short-term memory (LSTM) unit.

Reference will now be made in detail to example embodiments, examples of which are illustrated in the accompanying drawings, wherein like reference numerals refer to the like elements throughout. Example embodiments are described below to explain the present disclosure by referring to the figures.

Structural or functional descriptions of example embodiments in the present disclosure are intended for the purpose of describing example embodiments and the example embodiments may be implemented in various forms and may not be construed as being limited to those described in the present disclosure.

Although terms of "first" or "second" are used to explain various components, the components are not limited to the terms. These terms are used only to distinguish one component from another component. For example, a "first" component may be referred to as a "second" component, or similarly, the "second" component may be referred to as the "first" component within the scope of the right according to the concept of the present disclosure.

It may be noted that if it is described in the specification that one component is "connected," "coupled," or "joined" to another component, a third component may be "connected," "coupled," and "joined" between the first and second components, although the first component may be directly connected, coupled or joined to the second component. In addition, it may be noted that if it is described in the specification that one component is "directly connected" or "directly joined" to another component, a third component may not be present therebetween. Likewise, expressions, for example, "between" and "immediately between" and "adjacent to" and "immediately adjacent to" may also be construed as described in the foregoing.

As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those understood by one of ordinary skill in the art. Terms defined in dictionaries used may be construed to have meanings matching contextual meanings in the related art and are not to be construed as an ideal or excessively formal meaning unless otherwise defined herein.

In the following description, a memory cell unit according to example embodiments may be included in a vehicle, a television (TV), a mobile phone or other electronic devices, and may be used for speech recognition, video analysis, time series analysis or natural language processing. Example embodiments may be implemented as various products, for example, personal computers (PC), laptop computers, tablet computers, smartphones, smart home appliances, or wearable devices. Hereinafter, example embodiments will be described in detail with reference to the accompanying drawings, and like reference numerals refer to the like elements throughout.

FIG. 1 is a diagram illustrating an architecture of a standard long short-term memory (LSTM) unit 100. In a recurrent neural network (RNN), an LSTM unit may retain inputs in a memory for a very long period of time in comparison to other memory elements.

Referring to FIG. 1, the LSTM unit 100 includes an input gate 110, a first sigmoid unit 120, a first multiplier 125, a forget gate 130, a second multiplier 135, an internal memory 140, a second sigmoid unit 150, an output gate 160 and a third multiplier 165.

For example, an element-wise product of a vector value output from a sigmoid unit (for example, a value limited to a range of "0" to "1" by a sigmoid function) and a vector value output from a gate may be transferred to the internal memory 140. The input gate 110, the forget gate 130 and the output gate 160 may be configured to determine how much the vector value output from the sigmoid unit passes the input gate 110, the forget gate 130 and the output gate 160, and accordingly the input gate 110, the forget gate 130 and the output gate 160 may be called "gates."

The input gate 110 may determine a degree to which an input value $x_t$ is reflected based on a gating function $i_t$. The input value $x_t$ may be an input feature vector or an input vector. The input gate 110 may determine a degree to which an input vector value is used to calculate a new hidden state value.

The input gate 110 may receive an input value along with a previous cell state value that is fed back. When a value close to zero is output from the input gate 110, the input gate 110 may block the value from being transferred or passing through the input gate 110 regardless of the input value.

The input gate 110 may be a hyperbolic tangent "tan h" as a gate activation function. An output value of the input gate 110 may indicate a number of elements (for example, input values) that are to pass. For example, a value of "0" output from the input gate 110 may indicate that no element passes, and a value of "1" output from the input gate 110 may indicate that all the elements pass.

The first sigmoid unit 120 may be represented by $y=s(\Sigma w_i x_i)$. In $y=s(\Sigma w_i x_i)$, $s$ denotes a squashing function, for example, a logistic function, $x_i$ denotes an input value, and $w_i$ denotes a weight for the input value. A sigmoid unit may be referred to as a "sigmoid layer" or a "sigmoid neural network layer."

The first multiplier 125 may multiply an output value of the input gate 110 and an output value of the first sigmoid unit 120 and may transfer a value obtained by the multiplying to the internal memory 140. The first multiplier 125 may perform an element-wise multiplying operation. The second multiplier 135 and the third multiplier 165 may also perform the element-wise multiplying operation.

The forget gate 130 may determine how much the cell state value is to be forgotten or remembered based on a gating function $f_t$. For example, the forget gate 130 may determine a degree to which the cell state value is forgotten.

When the forget gate 130 outputs a value close to zero, the value may be forgotten regardless of a value that is remembered as a cell state value $c_t$. For example, when a value close to zero is output from the forget gate 130, the forget gate 130 may block the cell state value from being transferred again to the internal memory 140.

The second multiplier 135 may multiply an output value of the forget gate 130 and the cell state value $c_t$ of the internal memory 140. The internal memory 140 may receive a multiplication result of the second multiplier 135.

The internal memory 140 may store the cell state value $c_t$. The internal memory 140 may generate a candidate group of current cell state values that are to be added to previous cell state values, that is, generate a vector of candidate state values. The internal memory 140 may add a product of a previously stored value of a memory (for example, a previous cell state value) and the output value of the forget gate 130, to a product of a newly calculated hidden state value and the output value of the input gate 110. The adding may be performed to add a new input value to a previous value (for example, a previous cell state value) of the internal memory 140. For example, when the forget gate 130 has a value of "0," all previous values of the internal memory 140 may be ignored. When the input gate 110 has a value of "0," all new input values may be ignored.

For example, the internal memory 140 may perform an addition operation, for example, $y=\Sigma w_i x_i$. Because an output value (for example, the cell state value $c_t$) of the internal memory 140 is not squashed along with an output value of a sigmoid unit, the same value may be remembered during a large number of time steps and the value may not be decayed.

The cell state value $c_t$ may be fed back to the internal memory 140 through the second multiplier 135. Thus, the LSTM unit 100 may continue to remember the cell state value $c_t$ during a period of time in which the forget gate 130 allows. The cell state value $c_t$ may be fed back to three gates, that is, the input gate 110, the forget gate 130 and the output gate 160, for gating decisions.

The second sigmoid unit 150 may operate similarly to the first sigmoid unit 120. The second sigmoid unit 150 may also be a hyperbolic tangent "tan h" as a gate activation function."

The second sigmoid unit 150 may receive the cell state value $c_t$ from the internal memory 140 and may pass at least a portion of the cell state value $c_t$.

The output gate 160 may receive the cell state value $c_t$ from the internal memory 140 and may determine a degree to which the cell state value $c_t$ is to be output, that is, a degree to which a current cell state value is to be output from the LSTM unit 100.

The third multiplier 165 may output a value $h_t$ obtained by multiplying an output value of the output gate 160 and an output value of the second sigmoid unit 150. The output value $h_t$ may be referred to as a "hidden state output vector" or a "hidden output vector."

Each of the input gate 110, the forget gate 130 and the output gate 160 may determine how many times a gate is open or closed when an input value is input, that is, determine a degree to which an input value is reflected by selectively passing the input value. The degree to which a gate is open or closed may be represented by an analog value between "0" and "1" instead of a digital value, for example, "0" and "1."

Elements located on a straight line connecting the input feature vector $x_t$ input to the LSTM unit 100 to the hidden output vector $h_t$ may calculate values applied as input values to a memory of the LSTM unit 100 based on a condition.

An update equation of gating functions, the cell state value $c_t$ and the hidden output vector $h_t$ of the LSTM unit 100 may be expressed as shown in Equation 1 below.

[Equation 1]

$$i_t = \sigma_i(x_t W_{xi} + h_{t-1} W_{hi} + w_{ci} \odot c_{t-1} + b_i) \quad (1)$$

$$f_t = \sigma_f(x_t W_{xf} + h_{t-1} W_{hf} + w_{cf} \odot c_{t-1} + b_f) \quad (2)$$

$$c_t = f_t \odot c_{t-1} + i_t \odot \sigma_c(x_t W_{xc} + h_{t-1} W_{hc} + b_c) \quad (3)$$

$$o_t = \sigma_o(x_t W_{xo} + h_{t-1} W_{ho} + w_{co} \odot c_t + b_0) \quad (4)$$

$$h_t = o_t \odot \sigma_h(c_t) \quad (5)$$

In Equation 1, $x_t$ denotes the input feature vector and $h_t$ denotes the hidden output vector. Also, $b_i$, $b_f$, and $b_o$ denote a bias value of the input gate 110, a bias value of the forget gate 130 and a bias value of the output gate 160, respectively. The input gate 110, the forget gate 130 and the output gate 160 may have sigmoidal nonlinearities $\sigma_i$, $\sigma_f$, and $\sigma_o$ and tan h nonlinearities with weight parameters $W_{xi}$, $W_{hi}$, $W_{xf}$, $W_{hf}$, $W_{xo}$ and $W_{ho}$. Also, $h_{t-1}$ denotes a previous output value and $c_{t-1}$ denotes a previous cell state value.

The LSTM unit 100 may use gating functions $i_t$, $f_t$, and $o_t$ that represent the input gate 110, the forget gate 130 and the output gate 160 at a time t, respectively. The cell state value $c_t$ may be a cell activation vector.

The cell state value $c_t$ may be updated by a fraction of the previous cell state value $c_{t-1}$ that is controlled by the gating function $f_t$ of the forget gate 130. $b_c$ denotes a bias value for the cell state value $c_t$.

The cell state value $c_t$ may be generated by an element-wise product or Hadamard product, denoted by $\odot$, of the gating function $i_t$ of the input gate 110 and a cell state value nonlinearity $\sigma_c$. Optional peephole connection weights $w_{ci}$, $w_{cf}$, and $w_{co}$ may have a further influence on an operation of the input gate 110, the forget gate 130 and the output gate 160.

To minimize a total error of the LSTM unit 100 for a set of training sequences, an iterative gradient descent, for example, backpropagation through time, may be used to change each weight in proportion to a differential coefficient or a derivative. A major problem with a gradient descent for a standard RNN is that error gradients exponentially quickly vanish with a size of a time lag between events.

However, when error values are back-propagated from an output in the LSTM unit 100, an error may be trapped in a memory portion of the LSTM unit 100, which may be referred to as an "error carousel," which continuously supplies errors to each of gates until the memory portion of the LSTM unit 100 is trained to cut off error value(s). Thus, regular backpropagation may be effective in training of the LSTM unit 100 to remember values for very long durations.

To execute inference, an RNN may perform processing in a time-stepped scheme so that an entire network may be updated simultaneously on each clock tick, which may be non-ideal for reasons described below.

First, a full update of all units in the RNN at all time steps may be performed, which may be wasteful for a unit that does not need to be updated.

Second, integration of inputs from sensors that run in a continuous time may be enabled. Currently dominant schemes of integrating inputs may lose potentially precise timing information.

Third, there is no scheme to achieve integration of a plurality of sensors with different timings, which is an issue that is to be taken into consideration based on a proliferation of multi-sensor platforms in next-generation systems, for example, the Internet of Things (IoT) and autonomous cars and drones.

Even though fixed time steps are perfectly suitable for many RNN applications, there are several scenarios in which constant update rates impose constraints that affect an accuracy and efficiency of an RNN. Many real-world tasks for autonomous vehicles or robots may integrate inputs from various sensors, for example, for vision, audition, distance measurements, or gyroscopes. Each sensor may have a data sampling rate of each sensor, and short time steps may be used to deal with sensors with high sampling frequencies. However, an unnecessarily higher computational load and power consumption may occur so that all units in a network may be updated with a single time step. An interesting new application area may be processing of event-based sensors that are data-driven, and record stimulus changes in the world with short latencies and accurate timing.

Processing asynchronous outputs of sensors with time-stepped models may use high update frequencies, thereby counteracting potential power savings of event-based sensors. Biological neurons may communicate with spikes, and accordingly may perform asynchronous, event-triggered updates in a continuous time. A new RNN model for processing inputs sampled at asynchronous times may be used.

Figure 2:
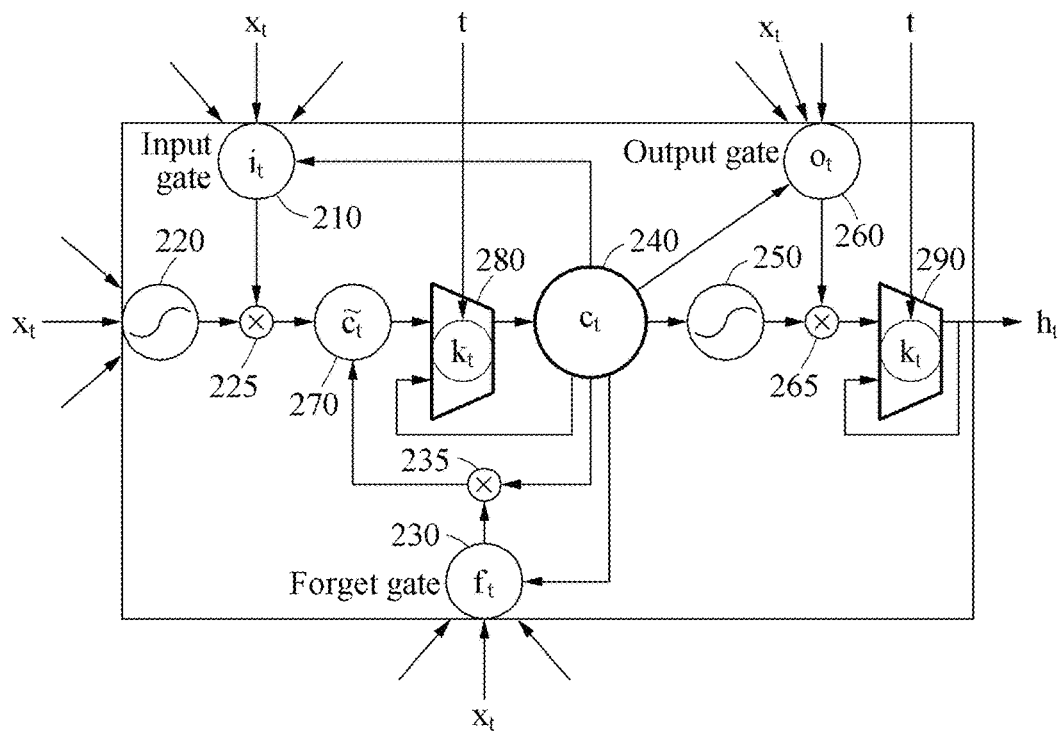
FIG. 2 is a diagram illustrating an architecture of a memory cell unit according to an example embodiment.

FIG. 2 is a diagram illustrating an architecture of a memory cell unit 200 according to an example embodiment. Referring to FIG. 2, the memory cell unit 200 includes an input gate 210, a first sigmoid unit 220, a first multiplier 225, a forget gate 230, a second multiplier 235, a first internal memory 240, a second sigmoid unit 250, an output gate 260, a third multiplier 265, a second internal memory 270, a first time gate 280 and a second time gate 290.

An operation of each of the input gate 210, the first sigmoid unit 220, the first multiplier 225, the forget gate 230, the second multiplier 235, the first internal memory 240, the second sigmoid unit 250, the output gate 260 and the third multiplier 265 may be the same as an operation of each of the input gate 110, the first sigmoid unit 120, the first multiplier 125, the forget gate 130, the second multiplier 135, the internal memory 140, the second sigmoid unit 150, the output gate 160 and the third multiplier 165 of FIG. 1, and accordingly further description thereof is not repeated and a difference between operations will be described below.

Unlike the LSTM unit 100 of FIG. 1, the memory cell unit 200 includes at least one time gate, for example, the first time gate 280 and the second time gate 290. The first time gate 280 and the second time gate 290 may control either one or both of a cell state value and an output value based on a phase signal of an oscillatory frequency. For example, the first time gate 280 and the second time gate 290 may control a degree to which the output value is output and determine whether the cell state value is to be maintained or updated, based on the phase signal. The first time gate 280 and the second time gate 290 may have a gating function $k_t$. In the present disclosure, a phase signal of an oscillatory frequency may be equivalent to any periodic signal.

The phase signal may be generated by an oscillator. The phase signal may be represented by a timestamp t. Because a control based on a phase signal may be regarded as a control based on a modulation of the phase signal, a time gate may be referred to as a "time modulation gate." Also, the memory cell unit 200 may perform a control based on a phase signal, and accordingly may be referred to as a "Phased LSTM" or "PLSTM."

The first internal memory 240 may store a first cell state value $c_t$, and the second internal memory 270 may store a second cell state value $\overline{C_t}$ affected by the forget gate 230. The first time gate 280 may selectively output one among two inputs, that is, the first cell state value $c_t$ and the second cell state value $\overline{C_t}$, based on a phase signal t. The first time gate 280 may operate as a 2-to-1 multiplexer (MUX) or a selector.

The first time gate 280 may determine whether the cell state value is to be maintained or updated, based on the phase signal t. For example, when the phase signal t corresponds to an open phase, the first time gate 280 may update an output value to a new value (for example, the second cell state value $\overline{C_t}$) based on an input value of the memory cell unit 200. When the phase signal t corresponds to a closed phase, the first time gate 280 may maintain the cell state value (for example, the first cell state value $c_t$).

When the phase signal t corresponds to the open phase, a value transferred by the forget gate 230 to the first internal memory 240 may be updated. In an example, when the forget gate 230 outputs a value of "0," the cell state value may be decayed so that a value close to "0" may be transferred to the second internal memory 270. In another example, when the forget gate 230 outputs a value of "1," a previous cell state value may be transferred to the second internal memory 270, instead of being decayed. Thus, the first cell state value $c_t$ may be updated by an input value $x_t$ of the memory cell unit 200 and by the second cell state value $\overline{C_t}$ controlled by a gating function $f_t$ of the forget gate 230.

The second time gate 290 may determine whether a value output from the output gate 260 is to be maintained or updated, based on the phase signal. The second time gate 290 may receive, as inputs, an output value of the third multiplier 265 and an output value $h_t$ that is fed back. The second time gate 290 may output either the output value of the third multiplier 265 or the output value $h_t$, based on the phase signal.

The output gate 260 may output a value of "0" to "1" determined by, for example, a gating function $o_t$, a parameter or a bias value. The third multiplier 265 may output a result of multiplication of an output value of the second sigmoid unit 250 and the output value of the output gate 260.

The first time gate 280 and the second time gate 290 may function as shields to maintain an internal state of the memory cell unit 200 without a change. For example, in a closed phase that will be described with reference to FIG. 3, the first time gate 280 and the second time gate 290 may function to block external input(s). An operating phase of a time gate according to an example embodiment will be described with reference to FIG. 3.

The first cell state value $c_t$ and the hidden state output value $h_t$ of the memory cell unit 200 may be updated while the first time gate 280 and the second time gate 290 operate in the open phase. When the first time gate 280 and the second time gate 290 operate in the open phase, the cell state value may be updated based on the input value of the memory cell unit 200. When the first time gate 280 and the second time gate 290 operate in the closed phase, the cell state value may remain unchanged regardless of the input value.

Opening and closing of the first time gate 280 and the second time gate 290 may be controlled by, for example, any one or any combination of three parameters, for example, parameters $\tau$, $\tau_{on}$, and s. The parameter $\tau$ may represent an oscillation period. The parameter $r_{on}$ may represent an open ratio of a duration of the open phase to the oscillation period $\tau$. The parameter s may represent a phase shift of an oscillation to each of cells in the memory cell unit 200.

The opening and closing of the first time gate 280 and the second time gate 290 may be controlled by rhythmic oscillations that are independent of each other in each time gate and that are specified by at least one parameter. The three parameters may be trained in advance in a training process.

The first time gate 280 and the second time gate 290 may be controlled by a parameterized oscillation.

To successfully propagate gradients based on a gradient descent scheme, a linearized formulation of a time gate may be used as shown in Equation 2 below.

[Equation 2]

$$\phi_t = \frac{(t-s)\bmod \tau}{\tau}, \qquad (6)$$

$$k_t = \begin{cases} \dfrac{2\phi_t}{r_{on}}, & \text{if } \phi_t < \dfrac{1}{2}r_{on} \\ 2 - \dfrac{2\phi_t}{r_{on}}, & \text{if } \dfrac{1}{2}r_{on} < \phi_t < r_{on} \\ \alpha\phi_t, & \text{otherwise} \end{cases}$$

In Equation 2, $\phi_t$ denotes an auxiliary variable that represents a phase inside a cycle of an oscillatory frequency. The auxiliary variable $\phi_t$ may be used to track a position within a phase.

Figure 3:
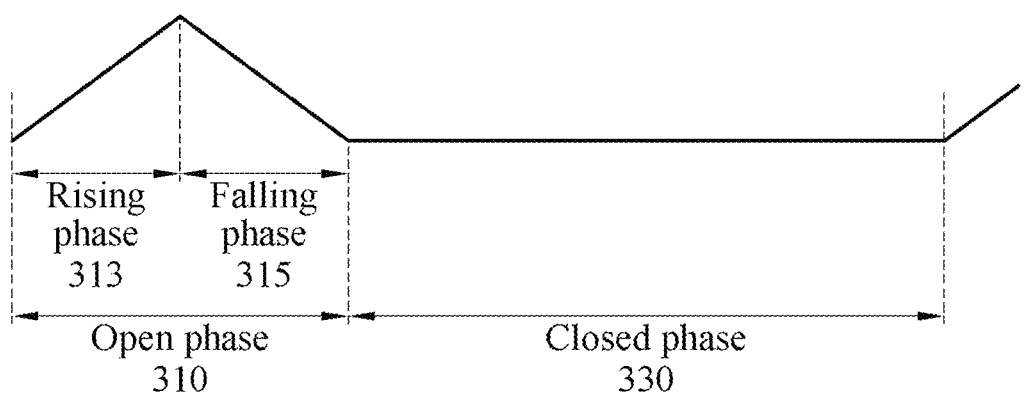
FIG. 3 is a diagram illustrating an operating phase of a time gate, according to an example embodiment.

FIG. 3 is a diagram illustrating an operating phase 300 of a time gate, according to an example embodiment. FIG. 3 illustrates an open phase 310 and a closed phase 330.

The open phase 310 may include a rising phase 313 in which a phase signal changes from a first state to a second state, and a falling phase 315 in which the phase signal changes from the second state to the first state. For example, the first state may correspond to a value of "0" and the second state may correspond to a value of "1." Also, the open phase 310 may further include a phase in which the second state is maintained, between the rising phase 313 and the falling phase 315.

In the closed phase 330, the first state of the phase signal may be maintained. For example, a phase signal in which a first state and a second state are reversed may be used. In this example, the second state of the phase signal may be maintained in the closed phase.

According to an example embodiment, a time gate may operate based on the open phase 310 and the closed phase 330. In the open phase 310, the time gate may update a memory cell unit based on an input value. During the rising phase 313 and the falling phase 315, an external input value may have an influence on an internal state of the memory cell unit. During the open phase 310, the time gate may update, for example, an output value and a cell state value of the memory cell unit based on the input value.

In the closed phase 330, the time gate may maintain a previous value stored in the memory cell unit without a change. During the closed phase 330, an output and the internal state of the memory cell unit may not be affected by an external input.

The time gate may be controlled by a shaped pulse corresponding to a small fraction of an oscillation period of an oscillatory frequency. In the present disclosure, a oscillation period may be a period of a periodic signal.

The time gate may be controlled by a parameterized oscillation and a frequency range in which an update of the memory cell unit is performed during a fraction of the oscillation period. A shape of a pulse that controls opening of the time gate may not be restricted to a single formulation.

When the time gate operates in a closed phase, a previous state may be maintained. When the time gate is partially open, a balance between the previous state and a proposed update may be formed. When the time gate operates in a fully open phase, the time gate may function as an LSTM unit that does not include a time gate.

The time gate may be controlled by a continuous-time phase signal that allows the memory cell unit to learn a natural rhythm of attention on different input streams that are input or sensed using, for example, a continuous-time vision sensor or an asynchronous pulse-generating vision sensor and/or auditory sensors).

The opening of the time gate may lead to an "on" phase for an update of the memory cell unit, and closing of the time gate may lead to an "off" phase in which the memory cell unit is not updated and the previous state is maintained.

Because an updating rate of the memory cell unit may be lower than a data sampling rate, an amount of computation may be substantially less than a time-stepped network using the data sampling rate. Also, for event-based sensors, the memory cell unit may act as a data-driven network that is updated only when new data arrives.

The memory cell unit may achieve faster convergence than LSTM units on tasks that perform learning of long sequences, with an update imposed by an oscillation during a fraction of the oscillation period. Thus, the memory cell unit may integrate inputs from sensors with arbitrary sampling rates, to process asynchronous sensory events that carry timing information. Also, the memory cell unit may greatly enhance a performance of an RNN and may reduce complexity of computation.

Figure 5:
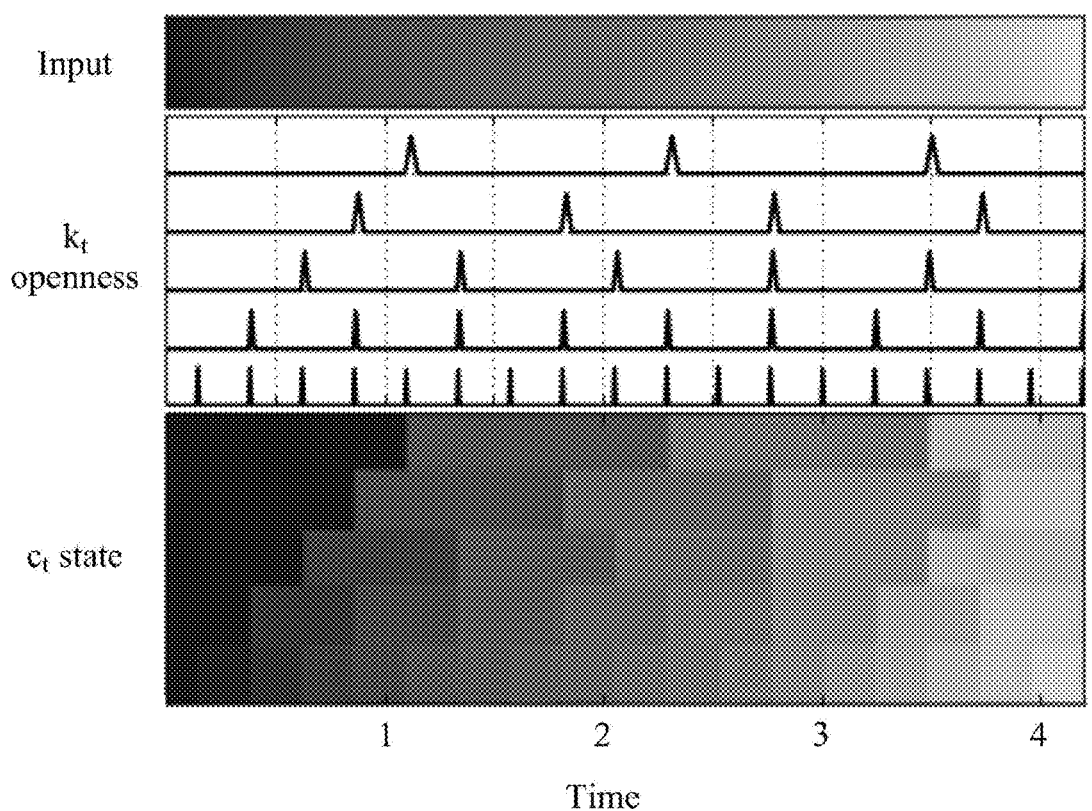
FIG. 5 is a diagram illustrating a change in a cell state value, based on opening and closing of time gates, according to an example embodiment.

An operation of the time gate will be further described with reference to FIG. 5. FIG. 5 illustrates a scheme by which an input flows in a time gate, is selectively blocked or allowed and is stored as a new state.

Figure 4:
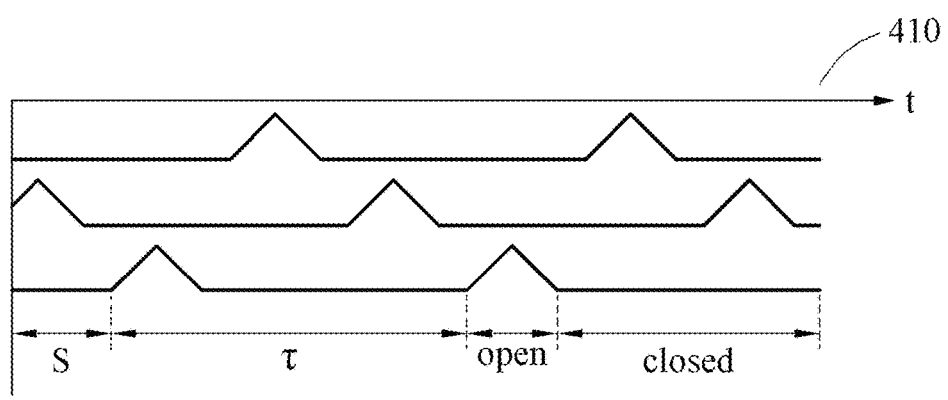
FIG. 4 is a diagram illustrating an operation of a recurrent neural network (RNN) including memory cell units in a continuous time, according to an example embodiment.
Figure 4:
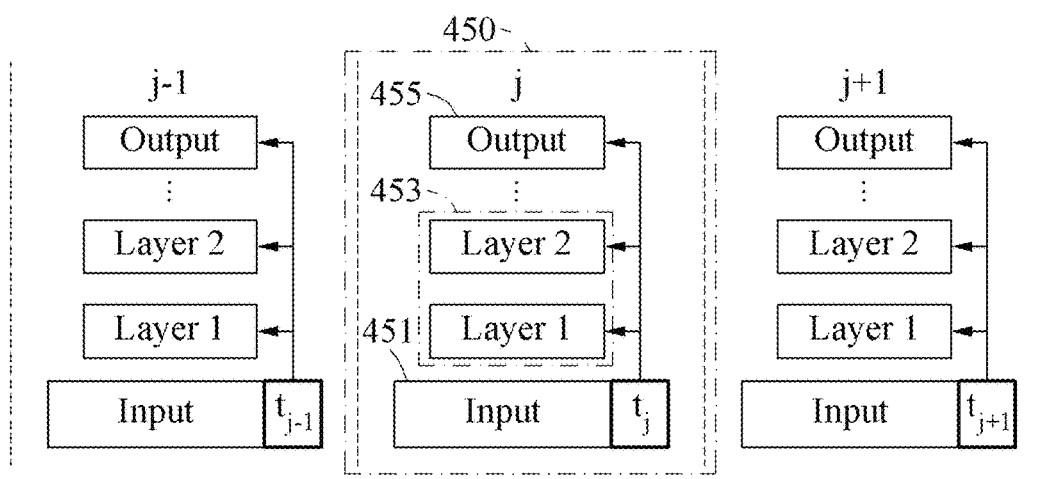

FIG. 4 is a diagram illustrating an operation of an RNN including memory cell units in a continuous time, according to an example embodiment. FIG. 4 illustrates a rhythmic oscillation 410 to time gates included in memory cell units (for example, neurons) and an RNN 450 including multi-layer memory cell units.

The rhythmic oscillation 410 may include an oscillation period τ and a phase shift s of time gates included in three different memory cell units.

During a closed phase, a leak with a rate α may be performed in a time gate. The leak may propagate gradient information even when the time gate is closed. Also, a linear slope of a gating function $k_t$ during an open phase of the time gate may allow an effective transmission of error gradients.

The RNN 450 may include an input layer 451, a hidden layer 453 and an output layer 455. The hidden layer 453 may include a plurality of memory cell units that each includes at least one time gate described above.

Each of layers in the RNN 450 may receive a timestamp t corresponding to a current time (for example, no inter-layer delays). The timestamp t may correspond to a phase signal. The phase signal may be applied to layers (for example, the input layer 451, the hidden layer 453 and the output layer 455) that are updated at the same time.

Values input to the RNN 450 may be sampled from a continuous input signal. The values input to the RNN 450 may be sampled regularly and synchronously, or sampled irregularly and asynchronously.

At least one time gate included in each of the memory cell units in the RNN 450 may be controlled by different oscillation frequencies or the same oscillation frequency.

The RNN 450 may receive a plurality of input values with different sampling rates. Each of phase signals may include different open phases corresponding to the different sampling rates.

In the RNN 450, a memory cell unit may be selectively updated at irregularly sampled points in time $t_j$. Because the updating is possible at irregularly sampled points in time, the RNN 450 may operate with even-driven, asynchronously sampled input data. In the present disclosure, cell states at the point in time $t_j$ (similarly to other gates and units) are denoted by $c_j=c_{t_j}$, and a cell state at a previous point in time $t_{j-1}$ for updating is denoted by $c_{j-1}$.

Update equations for $c_j$ and $h_j$ of an LSTM unit described above in formulae (3) and (5) of Equation 1 may be represented using cell state update values $\tilde{c}_j$ and $\tilde{h}_j$ mediated by a time gate, as shown in Equation 3 below.

[Equation 3]

$$\tilde{c}_j = f_j \odot c_{j-1} + i_j \odot \sigma_c(x_j W_{xc} + h_{j-1} W_{hc} + b_c) \qquad (7)$$

$$c_j = k_j \odot \tilde{c}_j + (1-k_j) \odot c_{j-1} \qquad (8)$$

$$\tilde{h}_j = o_j \odot \sigma_h(c_j) \qquad (9)$$

$$h_j = k_j \odot \tilde{h}_j + (1-k_j) \odot h_{j-1} \qquad (10)$$

FIG. 5 is a diagram illustrating a change in a cell state value, based on opening and closing of time gates, according to an example embodiment. FIG. 5 illustrates an operation of a memory cell unit (for example, a PLSTM) based on a time, an input, $k_t$ openness of time gates and a cell state value $c_t$.

A linearly increasing function may be used as an input. When the time gates operate in an open phase, inputs applied to the time gates may be updated as a new cell state and may be maintained until a next open phase.

Time gates included in different layers may be controlled by different oscillation frequencies or the same oscillation frequency. An open phase of a time gate included in a layer may be different from an open phase of a time gate included in another layer. An oscillation frequency range corresponding to a single layer may be different from an oscillation frequency range corresponding to another layer.

The time gates may have different oscillation periods τ, an identical phase shift s and an open ratio $r_{on}$ of "0.05."

The memory cell unit may have a rate of a memory decay. For example, a task of maintaining an initial memory state $c_0$ as long as possible instead of receiving additional inputs when $i_j$ is equal to zero in all time steps, may be taken into consideration.

For example, a cell state value $c_n$ of a standard LSTM including a nearly fully-opened forget gate with a gating function $f_j=1-\theta$ after the standard LSTM is updated "n" times may be represented as shown in Equation 4 below.

$$c_n = f_n \odot c_{n-1} = (1-\epsilon) \odot (f_{n-1} \odot c_{n-2}) = \ldots = (1-\epsilon)^n \odot c_0 \qquad \text{[Equation 4]}$$

Equation 4 indicates that a value (for example, a cell state value) of a memory with $\epsilon < 1$ decays exponentially with each time step.

Conversely, a memory cell unit may decay only during an open period of a time gate. For example, when $k_t=0$ is satisfied for $t_{j-\Delta} \leq t \leq t_j$, the memory cell unit may maintain a perfect memory value during a closed phase, for example, $c_j = c_{j-\Delta}$. Thus, during a single oscillation period of a length τ, the memory cell unit may be updated during a duration of $r_{on} \tau$ that may result in substantially less than "n" update steps.

Due to the above cyclic memory, the memory cell unit may have a longer and adjustable memory length via the parameter τ.

Oscillations may impose sparse updates of memory cell units, and thus it is possible to substantially reduce a total number of updates.

During training, the above sparseness of updates may ensure that a gradient is used for backpropagation through a smaller number of updates, to allow an undecayed gradient to be back-propagated through time and allow faster learning convergence.

Similarly to shielding of a cell state and a gradient of the cell state by an input gate and a forget gate of the standard LSTM, the time gate may prevent external inputs and time steps from dispersing and mixing the gradient of the cell state.

Figure 6A:
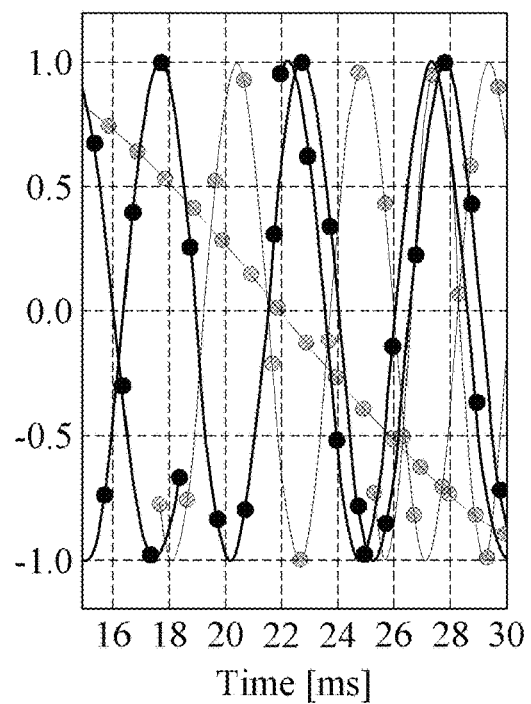
FIGS. 6A, 6B, 6C, and 6D are graphs illustrating examples in which input values of a memory cell unit (for example, a PLSTM) have different sampling rates, according to an example embodiment.
Figure 6B:
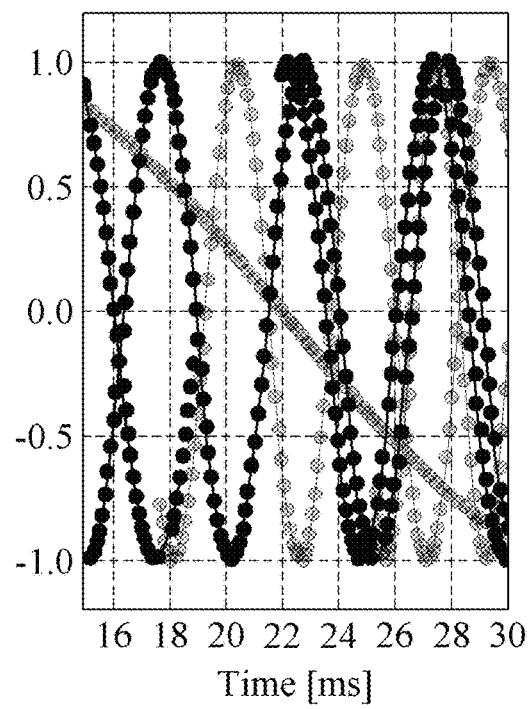
Figure 6C:
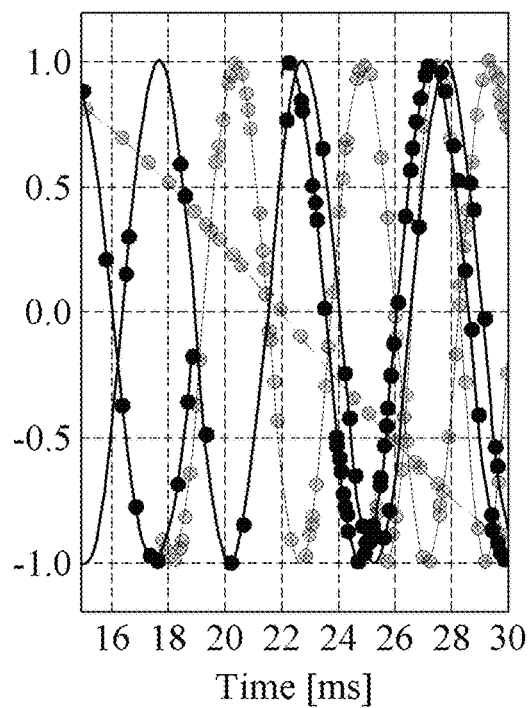
Figure 6D:
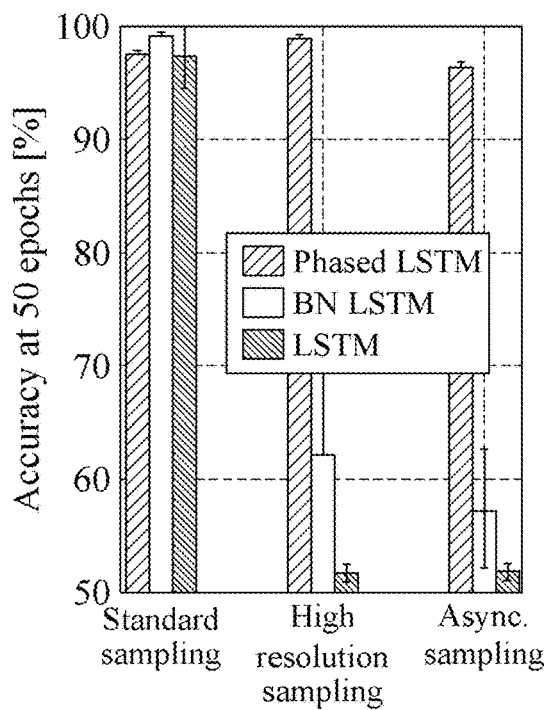

FIGS. 6A, 6B, 6C, and 6D are graphs illustrating examples in which input values of a memory cell unit (for example, a PLSTM) have different sampling rates, according to an example embodiment. FIG. 6A shows inputs of single-frequency sine waves that are regularly sampled, FIG. 6B shows inputs of sine waves that are sampled at a high resolution, and FIG. 6C shows inputs of sine waves that are irregularly sampled. Also, FIG. 6D shows results obtained by training a PLSTM, a batch-normalized (BN)-LSTM and a standard LSTM based on the sampled inputs.

The PLSTM may be trained for classification when a frequency of a sampled sine wave is within a desired frequency band. In FIGS. 6A, 6B, 6C, and 6D, an X-axis represents a sampling time in milliseconds (ms), and a Y-axis represents an amplitude.

The PLSTM may be trained by waveforms that are distinguished with different frequencies and that correspond to black points and gray points in FIGS. 6A, 6B, and 6C. The PLSTM may be trained to distinguish different frequency sets. All points in FIGS. 6A, 6B, and 6C represent input points.

FIG. 6A illustrates a standard condition in which data is regularly sampled at each time interval of 1 ms and input. In the standard condition, sine waves may be regularly sampled at each time interval of 1 ms.

FIG. 6B illustrates a high-resolution sampling condition in which new input points are gathered at each time interval of 0.1 ms. In the high-resolution sampling condition, that is, an oversampling condition, sine waves may be regularly sampled at each time interval of 0.1 ms, resulting in ten times as many data inputs.

FIG. 6C illustrates an asynchronous sampling condition in which new input points are presented at intervals of 0.02 ms to 10 ms. In the asynchronous sampling condition, samples may be collected at asynchronous times over a duration of inputs.

FIG. 6D illustrates results of training the PLSTM, the BN-LSTM and the standard LSTM under the above sampling conditions of FIGS. 6A, 6B, and 6C.

As shown in FIG. 6D, an accuracy of the PLSTM is maintained to be substantially the same under the sampling conditions of FIGS. 6A, 6B, and 6C, whereas an accuracy of each of the BN-LSTM and the standard LSTM decreases under the sampling conditions of FIGS. 6B and 6C. Error bars represent a standard deviation for five training runs.

Hereinafter, a PLSTM in a variety of scenarios that use either a precise update time or learning from a long sequence according to an example embodiment will be described.

For example, the PLSTM may be trained by a learning scheme set to default learning rate parameters. Unless otherwise specified, a leak rate α may be set to "0.001" during training, and may be set to zero during a test. A phase shift s for each neuron may be uniformly selected at an interval [0, τ].

An open ratio $r_{on}$ of "0.05" may be fixed and may remain unchanged during training. An oscillation period τ and a phase shift s may be learned during training.

The PLSTM may be trained to distinguish two classes of sine waves from different frequency sets, for example, frequency sets with a period in a target range T~U(5,6) and frequency sets outside the target range, that is, T~{U(1,5) ∪U(6,100)}. U(a, b) denotes a uniform distribution on an interval (a, b).

The above task involves a periodic stimulus and uses a fine timing discrimination. Inputs may be denoted as pairs <y, t> in which y represents an amplitude and t represents a timestamp of a sample from an input sine wave. In FIG. 6, darker curves may be separated from lighter curves based on samples represented as points.

Also, the sine waves may have a random phase shift uniformly drawn from all possible shifts, random numbers of samples drawn from U(10, 500), a random duration drawn from U(10, 50), and a start time drawn from U(0, 100—duration). The classes may be balanced, yielding a success rate of 50%.

Single-layer RNNs may be trained on data shown in FIG. 6. Each of the RNNs may be repeated with five random initial seeds.

FIG. 6D shows a result obtained by comparing the PLSTM according to an example embodiment to an LSTM and a BN-LSTM found success in a predetermined application.

For the LSTM and BN-LSTM, a timestamp may be used as an additional input feature dimension. For the PLSTM, a time input (for example, a phase signal) may control a time gate.

For example, the LSTM and BN-LSTM may each include 2-110-2 neurons, and the PLSTM may include 1-110-2 neurons.

An oscillation period of the PLSTM may be uniformly drawn in an exponential space to provide a wide variety of applicable frequencies, for example, τ~exp(U(0, 3)). Parameters other than the oscillation period may match between applicable models.

As shown in FIG. 6D, the LSTM, the BN-LSTM and the PLSTM are all excellent under the standard sampling condition. However, for the same number of epochs, an increase in data sampling by a factor of ten has devastating effects for the LSTM and the BN-LSTM and greatly reduces an accuracy of each of the LSTM and the BN-LSTM.

For example, when sufficiently training iterations are provided, the accuracy of each of the LSTM and the BN-LSTM may return to a normal baseline. However, for the oversampled(*oversampling condition, the accuracy of the PLSTM actually increases when an amount of information about an underlying waveform to be received increases.

The PLSTM may not be evenly updated and may have an excellent performance for asynchronously sampled data, because a time gate does not need to be regularly updated and may be correctly sampled at a continuous time within a period.

Figure 8:
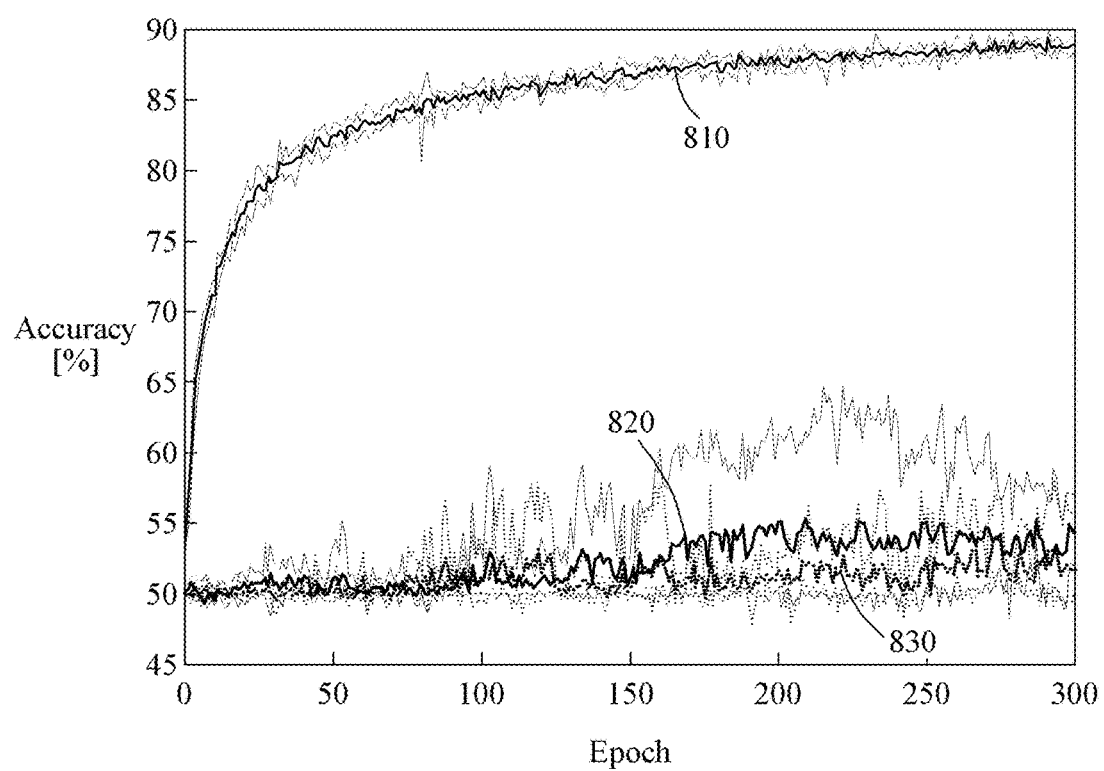
FIG. 8 is a graph illustrating an accuracy of each of a PLSTM, a batch-normalized (BN)-LSTM and an LSTM under asynchronous sampling conditions, according to an example embodiment.

How quickly the PLSTM converges to an exact solution in comparison to the standard LSTM, using exactly the same parameters will be analyzed based on a graph of FIG. 8.

Figure 7:
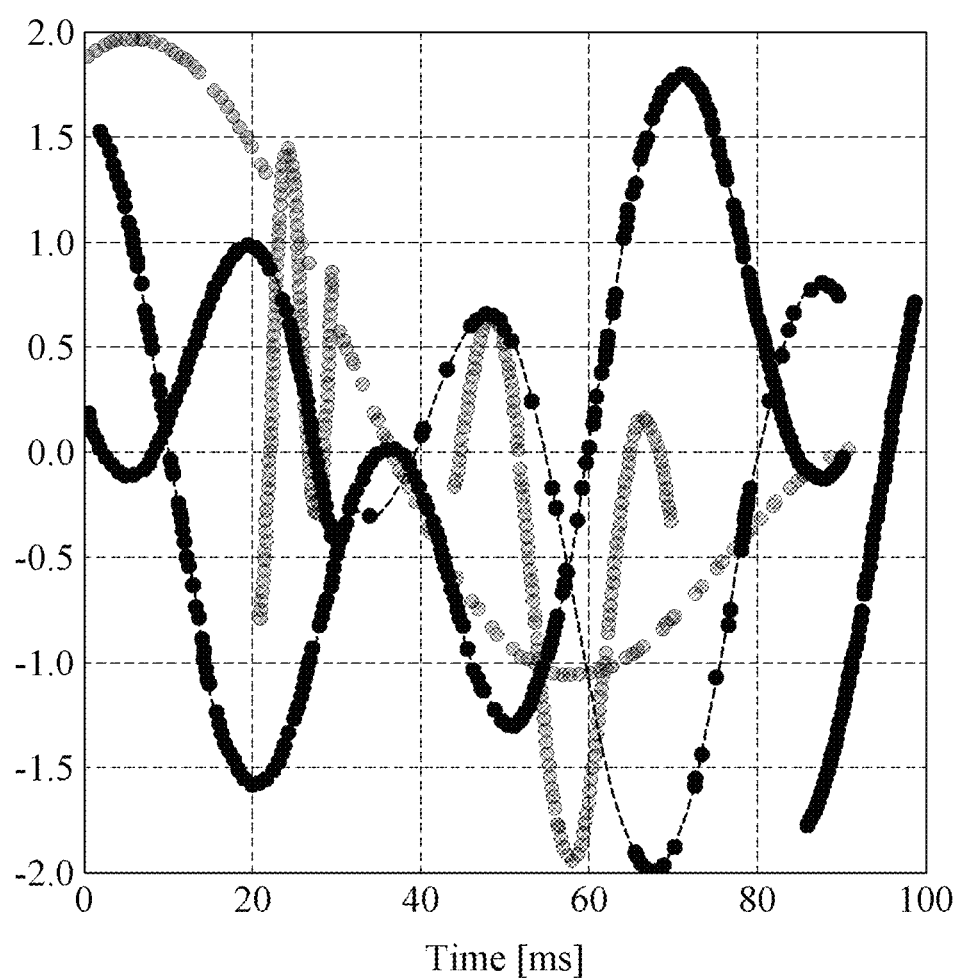
FIG. 7 is a graph illustrating an example in which two sine waves with different frequencies are mixed.

FIG. 7 is a graph illustrating an example in which two sine waves with different frequencies are mixed. In FIG. 7, a sine wave with a first frequency, and a sine wave with a second frequency are represented by a darker color and a lighter color, respectively.

When sine waves are mixed as shown in FIG. 7, a PLSTM according to an example embodiment may learn a scheme of distinguishing sine waves that overlap each other and that have different frequencies. The example of FIG. 7 is a task extended from the above task of FIG. 6.

FIG. 8 is a graph illustrating an accuracy of each of a PLSTM, a BN-LSTM and an LSTM under asynchronous sampling conditions, according to an example embodiment. FIG. 8 illustrates an accuracy of each of a PLSTM 810, a BN-LSTM 820 and an LSTM 830 during training on a task of superimposed frequencies.

The graph of FIG. 8 shows that the PLSTM 810 is extremely quickly trained in comparison to the BN-LSTM 820 and the LSTM 830 and that the PLSTM 810 has a high performance while exhibiting a lower variance in comparison to the BN-LSTM 820 and the LSTM 830 during training.

In the graph of FIG. 8, dark lines indicate a mean of the accuracy of each of the PLSTM 810, the BN-LSTM 820 and the LSTM 830, and shading portions show a maximum value and a minimum value for five repetitions. The accuracy of the PLSTM 810 quickly increases to an optimal accuracy. The PLSTM 810 may operate similarly to a learnable, gated Fourier transform, and accordingly it is possible to easily separate out oscillations with different characteristic frequencies.

While a goal is to separate a pure frequency, real stimuli may involve at least one frequency. To extend the PLSTM 810 to real stimuli, the PLSTM 810 may be applied to a combination of a plurality of frequencies. Also, an RNN may be used to discriminate two classes of sine waves with different characteristics.

To investigate a scheme of helping learning using a time gate when a memory for a relatively long period of time is performed, an LSTM task called an "adding task" may be introduced.

In the LSTM task, a sequence of random numbers may be provided along with an indicator input stream. When "0" is included in the indicator input stream, a value presented in the sequence may be ignored. When "1" is included in the indicator input stream, the value presented in the sequence may be added. The PLSTM 810 may generate a sum of all indicated values.

In the LSTM task, an input value may not have an inherent periodicity. Using a longer period of time for a time gate may allow more effective training when the PLSTM 810 opens for a few time steps during training.

In the LSTM task, a sequence of numbers, for example, numbers of a length of 490 to 510, may be drawn from U(−0.5, 0.5). Two numbers in a stream of numbers may be additionally marked. One among the two numbers may be from first 10% of the numbers (drawn with a uniform probability) and one may be in the last half (drawn with a uniform probability). The two numbers may generate a long and noisy stream of data with a few significant points.

The LSTM task may challenge the PLSTM 810 because there is no inherent periodicity and all time steps include marked points.

For example, when four sampling intervals, for example, $\exp(U(0,2))$, $\exp(U(2,4))$, $\exp(U(4,6))$ and $\exp(U(6,8))$, are compared, an oscillation period $\tau$ may be uniformly drawn in an exponential domain. Despite different oscillation periods, a total number of updates of the PLSTM 810, the BN-LSTM 820 and the LSTM 830 remains approximately the same, because an overall sparseness is set by an open ratio $r_{on}$. However, a longer oscillation period may provide a longer jump through past time steps for a gradient during a backpropagation through time.

When a longer period of time is used, the PLSTM 810 may more efficiently learn longer sequences. The PLSTM 810 may accelerate training when a longer oscillation period is used to more quickly learn longer sequences.

Figure 9:
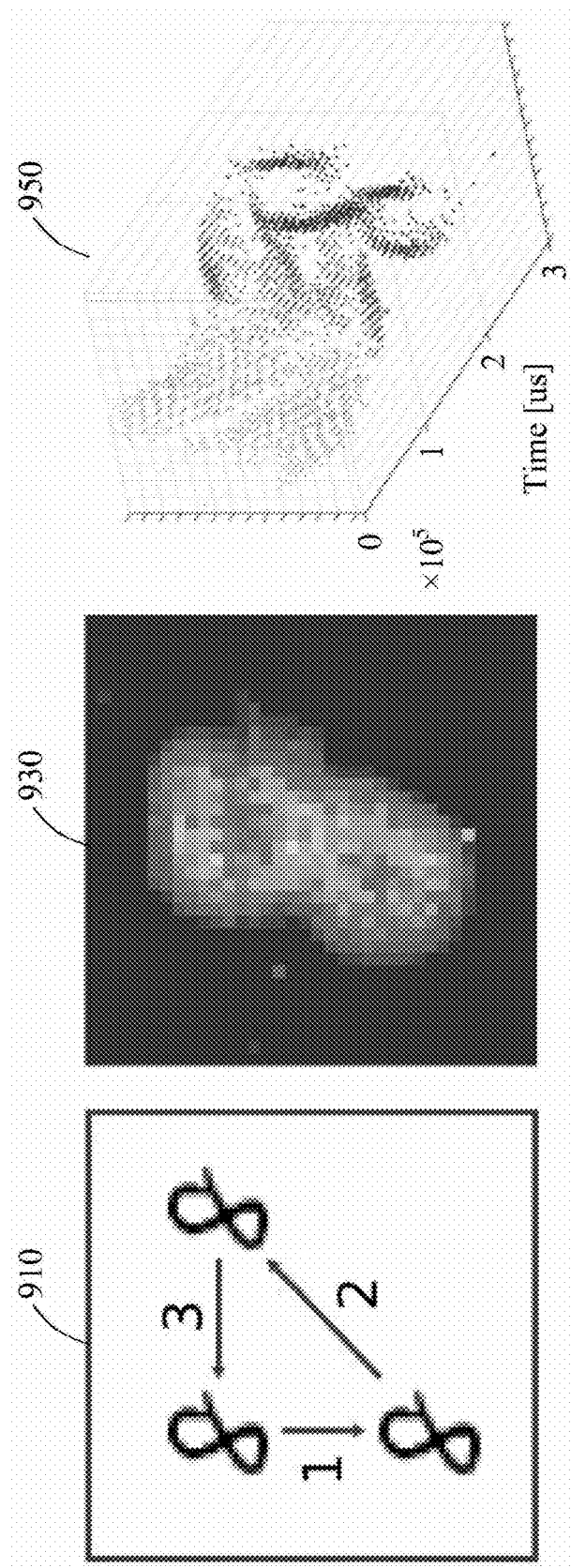
FIG. 9 is a diagram illustrating a result obtained by learning a dataset of a neuromorphic Mixed National Institute of Standards and Technology (N-MNIST) experiment based on an RNN, according to an example embodiment.

FIG. 9 is a diagram illustrating a result obtained by learning a dataset of a neuromorphic Mixed National Institute of Standards and Technology (N-MNIST) experiment based on an RNN, according to an example embodiment. The N-MNIST experiment may be used to identify digits.

FIG. 9 illustrates a sketch of a handwritten digit movement. A vision sensor may perform three saccades by moving down, moving diagonally and returning to an original position as shown in an image 910. An output of events that arrive from the vision sensor when a pixel increases or decreases in contrast may be logged.

An image 930 is a frame-based representation of "8" from an N-MNIST dataset obtained by integrating all input spikes for each pixel. When events are summed, a blurred representation that is difficult to learn may be generated as shown in the image 930.

An image 950 is a spatio-temporal representation of "8" represented in the three saccades of the image 910. The spatio-temporal representation may show "8" more clearly than a blurred frame-based representation.

Recording of FIG. 9 is acquired from an event-based vision sensor that is sensitive to local temporal contrast changes. An event may be generated from a pixel when a local contrast change exceeds a threshold. All events may be encoded as a 4-tuple <x, y, p, t> with a position (x, y) of a pixel, a polarity bit p indicating an increase or decrease in a contrast, and a timestamp t indicating a time at which an event is generated.

Recordings forming events may be generated by the vision sensor while the vision sensor performs three saccadic movements facing a static digit from the N-MNIST dataset of the image 910. An example of an event response (excluding a polarity) may be shown in the image 950.

In a previous task based on event-based input data, timing information may be removed occasionally, and instead a frame-based representation may be generated by computing a pixel-wise event-rate over a predetermined period of time as shown in the image 930.

A spatio-temporal surface of events in the image 950 may reveal details of a digit much clearer than in the blurred frame-based representation. A PLSTM may be used to directly operate spatio-temporal event streams.

TABLE 1

|  | CNN | BN-LSTM | Phased LSTM (T = 100 ms) |
| --- | --- | --- | --- |
| Accuracy at Epoch 1 | 73.81% ± 3.5 | 40.87% ± 13.3 | 90.32% ± 2.3 |
| Train/test ρ = 0.75 | 95.02% ± 0.3 | 96.93% ± 0.12 | 97.28% ± 0.1 |
| Test with ρ = 0.4 | 90.67% ± 0.3 | 94.79% ± 0.03 | 95.11% ± 0.2 |
| Test with ρ = 1.0 | 94.99% ± 0.3 | 96.55% ± 0.63 | 97.27% ± 0.1 |
| LSTM Updates | — | 3153 per neuron | 159 ± 2.8 per neuron |

Table 1 shows classification results of accuracy on an N-MNIST experiment for a convolutional neural network (CNN), a BN-LSTM and a PLSTM.

The CNN may be trained on frame-based representations of N-MNIST digits and two RNNs (for example, a BN-LSTM and a PLSTM that are trained directly on event streams). Because a result of an N-MNIST experiment for an LSTM is found to be worse, the LSTM is not shown in Table 1.

The CNN may include three alternating layers of 8 kernels of 5×5 convolution with a leaky rectified linear unit (ReLU) nonlinearity and 2×2 max-pooling. The three alternating layers may be fully connected to 256 neurons, and finally fully connected to 10 output classes.

An event address may be used to generate a 40-dimensional embedding via a learned embedding matrix, and may be combined with the polarity to generate an input.

A network architecture for the PLSTM may be, for example, 41-110-10. A network architecture for the BN-LSTM with a time given as an extra input dimension to the BN-LSTM may be, for example, 42-110-10. Table 1 shows that the PLSTM is trained faster than the CNN and the BN-LSTM and achieves much higher accuracy with a lower variance within a first epoch of training.

According to an example embodiment, a factor $\rho$ that represents a probability that an event is included may be defined. For example, $\rho$ of 1.0 may indicate that all events are included. RNN models may be trained with $\rho$ of 0.75, and again the PLSTM may achieve slightly higher performance than the BN-LSTM.

When testing with $\rho$ of 0.4 (fewer events) and $\rho$ of 1.0 (more events) is performed instead of retraining, both the PLSTM and the BN-LSTM may greatly outperform the CNN for identifying digits.

This is because accumulated statistics of a frame-based input to the CNN change drastically when overall spike rates change. An RNN with the PLSTM may learn a stable spatio-temporal surface on an input and may be slightly changed by sampling the input more or less frequently.

Each neuron of the PLSTM may be updated about 5% of a time on average, which may lead to an approximate 20-fold reduction in a run time to calculate costs.

159 updates may be performed for neurons of the PLSTM in comparison to 3153 updates performed for neurons of the BN-LSTM.

Figure 10:
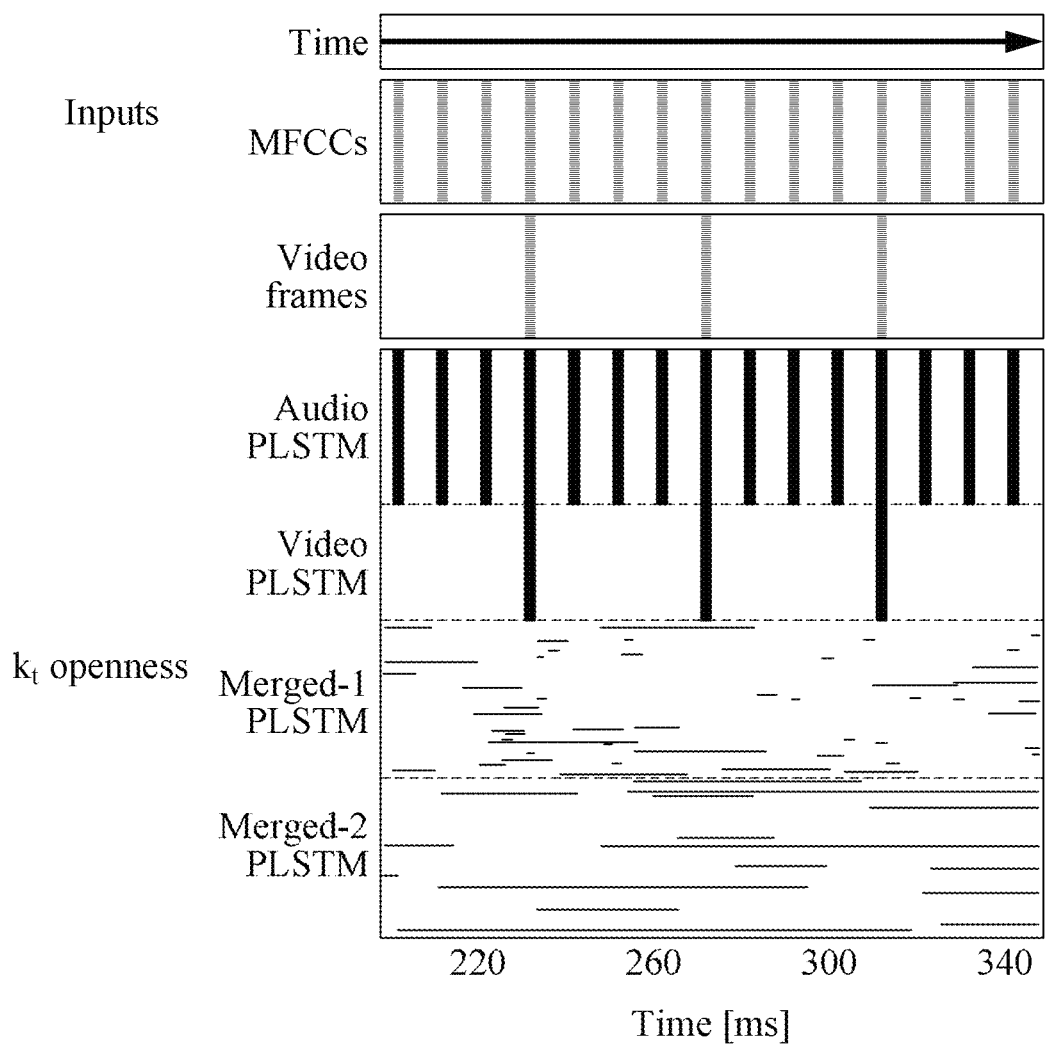
FIG. 10 is a diagram illustrating a method of fusing and processing a plurality of input values with different sampling rates in an RNN, according to an example embodiment.

FIG. 10 is a diagram illustrating a method of fusing and processing a plurality of input values with different sampling rates in an RNN, according to an example embodiment. FIG. 10 illustrates the plurality of input values and opening results of time gates for a lip reading experiment.

In FIG. 10, a video frame rate is 40 ms. A video frame rate of 25 frames per second (fps) corresponds to a plurality of audio input frequencies of 100 hertz (Hz). PLSTM timing parameters are aligned to a sampling time of inputs of the PLSTM timing parameters.

Mel-frequency cepstral coefficients (MFCCs) may be computed at each time interval of 40 ms with a network update.

A network architecture may separately process audio streams (MFCCs) and video frames (streams) before merging the audio frames and video frames in two RNN layers that receive two modalities.

An audio stream may connect 39-dimensional MFCCs (for example, 13 MFCCs with first and second derivatives) to 150 recurrent units.

A video stream may use three alternating layers including 16 kernels of 5×5 convolution and 2×2 subsampling to reduce an input of 1×48×48 to 16×2×2, which may be used as an input to 110 recurrent units.

For example, an open source computer vision (OpenCV) for implementing a face detector may be used for a video stream to extract a face that is resized to a grayscale of 48×48 pixels.

A goal is to obtain a model that may use audio alone, video alone, or both inputs (for example, audio and video) to robustly classify a sentence. However, because it is sufficient to achieve an accuracy greater than 99% by using the audio alone, sensor modalities may be randomly masked to zero during training to encourage robustness towards sensory noise and loss.

For example, inputs with different sampling rate, for example, audio having a high input sampling rate by a video input, may be fused using PLSTMs.

Both streams may converge to a Merged-1 layer with 250 recurrent units, and may be connected to a second hidden layer with 250 recurrent units named "Merged-2." An output of a Merged-2 layer may be a fully-connected layer to 51 output nodes that represent a vocabulary of GRID.

In a PLSTM network, all recurrent units may be PLSTM units.

In an audio PLSTM layer and video PLSTM layer, open periods of time gates may be aligned to sampling times of inputs, and learning of parameters $\tau$ and s may be disabled. Thus, representing of zeros or artificial interpolations to a network may be prevented when data is not present.

In merged layers, parameters of a time gate may be learned with a period $\tau$ of a first merged layer drawn from U(10, 1000) and a second merged layer drawn from U(500, 3000).

An example in which a PLSTM is used to merge sensors with different timings will be described. A PLSTM that may use audio information, visual information or both may be trained to transcribe speech.

A GRID corpus may be used, a face region may be extracted, and audio may be converted to MFCCs. A corpus may include video and audio of 30 speakers each uttering 1,000 sentences with a fixed grammar and a constrained vocabulary of 51 words. Data may be randomly divided into a 90%/10% train-test set.

Audio is provided at each time interval of 10 ms, and video is provided at 25 fps or at each time interval of 40 ms. A neural network may provide zeros on other modalities when the audio and video are not aligned.

In the PLSTM, a time gate may be aligned with an arrival of new input data and natively may operate at an update frequency of a corresponding sensor. In a higher layer, slow time constants may be selected to allow a slow fusion and mixing between audio and video data streams.

FIG. 10 illustrates a timing relationship between input data (for example, MFCCs and video frames) and PLSTMs.

In FIG. 10, audio (MFCCs) arrive at each time interval of 10 ms, while video frames arrive at each time interval of 40 ms.

Parameters of a gating function $k_t$ may be configured to align opening of a time gate with an arrival of data for an audio PLSTM layer and a video PLSTM layer. When the above two layers are separately processed, the two layers may be merged into a single RNN layer Merged-1 PLSTM with learnable and slow time constants, to provide mixing between sensory streams.

The RNN layer Merged-1 PLSTM may be abstracted with an even higher RNN layer Merged-2 PLSTM, before being classified. The RNN layer Merged-2 PLSTM intuitively shows sparsity of the PLSTM. The RNN layer Merged-2 PLSTM may be trained for a frequency discrimination task.

In FIG. 10, a black region corresponds to an open phase of neurons (PLSTMs) in which updating is performed similarly to an LSTM, while a white region corresponds to a closed phase in which updating is not performed. Computation is not required in the white region, and thus it is possible to reduce a large amount of computation.

The example embodiments described herein may be implemented using hardware components, software components, or a combination thereof. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described example embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the example embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules to perform the operations of the above-described example embodiments, or vice versa.

While this disclosure includes example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A memory cell unit comprising:
   a first time gate configured to control a cell state value of the memory cell unit, based on a phase signal of an oscillatory frequency; and
   a second time gate configured to control an output value of the memory cell unit, based on the phase signal,
   wherein the first time gate, based on the phase signal, selectively outputs either one of a first cell state value that is a previous state value of the memory cell unit and a second cell state value that is a current state value corresponding to an input value of the memory cell unit, and
   wherein the second time gate, based on the phase signal, selectively outputs either one of an existing output value fed back from the memory cell unit and a current output value output from an output gate.

2. The memory cell unit of claim 1, wherein the phase signal has:
   an open phase comprising a rising phase in which the phase signal changes from a first state to a second state, and a falling phase in which the phase signal changes from the second state to the first state; and
   a closed phase in which the first state of the phase signal is maintained.

3. The memory cell unit of claim 2, wherein the first time gate is further configured to:
   update the cell state value, based on the input value, in response to the phase signal being in the open phase; and
   maintain the cell state value regardless of the input value, in response to the phase signal being in the closed phase.

4. The memory cell unit of claim 2, wherein the second time gate is further configured to update the output value, in response to the phase signal being in the open phase.

5. The memory cell unit of claim 1, wherein the phase signal comprises an open phase corresponding to a fraction of an oscillation period of the oscillatory frequency.

6. The memory cell unit of claim 1, wherein the first time gate and the second time gate are further configured to open and close based on any one or any combination of an oscillation period of the oscillatory frequency, a ratio of a duration of an open phase to the oscillation period, and a phase shift in the oscillatory frequency, the open phase comprising a rising phase in which the phase signal changes from a first state to a second state, and a falling phase in which the phase signal changes from the second state to the first state.

7. The memory cell unit of claim 6, wherein the first time gate and the second time gate are further configured to open and close based on independent oscillations in a respective one of the first time gate and the second time gate, the independent oscillations being specified by any one or any combination of the oscillation period, the ratio of the duration of the open phase to the oscillation period, and the phase shift.

8. The memory cell unit of claim 6, wherein the oscillation period, the ratio of the duration of the open phase to the oscillation period, and the phase shift are trained in advance.

9. The memory cell unit of claim 1, wherein the memory cell unit is configured to be selectively updated based on input values of the memory cell unit that are asynchronously sampled.

10. The memory cell unit of claim 1, further comprising:
an input gate configured to determine a first degree to which the input value of the memory cell unit is reflected;
a forget gate configured to determine a second degree to which the cell state value is forgotten,
wherein the first time gate is further configured to determine, based on the phase signal, whether the cell state value is to be maintained or updated based on the first degree to which the input value is reflected and the second degree to which the cell state value is forgotten; and
the output gate configured to determine a third degree to which the cell state value is output, based on whether the cell state value is determined to be maintained or updated,
wherein the second time gate is further configured to determine, based on the phase signal, whether the output value is to be maintained or updated based on the third degree to which the cell state value is output.

11. The memory cell unit of claim 10, wherein the first time gate is further configured to update the cell state value, based on the input value and the cell state value that is controlled by a gating function of the forget gate.

12. The memory cell unit of claim 10, wherein the first time gate and the second time gate are configured to open and close based on an oscillation that is parameterized by parameters.

13. A recurrent neural network comprising:
an input layer;
a hidden layer comprising memory cell units, each of the memory cell units comprising:
a first time gate configured to control a cell state value of a respective one of the memory cell units, based on a phase signal of an oscillatory frequency; and
a second time gate configured to control an output value of the respective one of the memory cell units, based on the phase signal; and
an output layer,
wherein the first time gate, based on the phase signal, selectively outputs either one of a first cell state value that is a previous state value of the memory cell unit and a second cell state value that is a current state value corresponding to an input value of the memory cell unit, and
wherein the second time gate, based on the phase signal, selectively outputs either one of an existing output value fed back from the memory cell unit and a current output value output from an output gate.

14. The recurrent neural network of claim 13, wherein the recurrent neural network is configured to receive input values that are sampled from a continuous input signal.

15. The recurrent neural network of claim 13, wherein the first time gate and the second time gate are configured to open and close based on different oscillation frequencies or a same oscillation frequency.

16. The recurrent neural network of claim 13, wherein the recurrent neural network is further configured to receive input values with different sampling rates, and
each of phase signals corresponding to the input values comprises different open phases corresponding to the different sampling rates.

17. The recurrent neural network of claim 13, wherein the phase signal has:
an open phase comprising a rising phase in which the phase signal changes from a first state to a second state, and a falling phase in which the phase signal changes from the second state to the first state; and
a closed phase in which the first state of the phase signal is maintained.

18. The recurrent neural network of claim 17, wherein the first time gate is further configured to:
update the cell state value, based on the input value, in response to the phase signal being in the open phase; and
maintain the cell state value regardless of the input value, in response to the phase signal being in the closed phase.

19. The recurrent neural network of claim 17, wherein the second time gate is further configured to update the output valued, in response to the phase signal being in the open phase.

20. The recurrent neural network of claim 13, wherein the phase signal comprises an open phase corresponding to a fraction of an oscillation period of the oscillatory frequency, and
the first time gate and the second time gate are further configured to open and close based on any one or any combination of the oscillation period of the oscillatory frequency, a ratio of a duration of the open phase to the oscillation period, and a phase shift in the oscillatory frequency, the open phase comprising a rising phase in which the phase signal changes from a first state to a second state, and a falling phase in which the phase signal changes from the second state to the first state.

21. A memory cell unit comprising:
an input gate configured to determine a first degree to which an input value of the memory cell unit is reflected;
a first memory configured to store a first cell state value of the memory cell unit;
a forget gate configured to determine a second degree to which the first cell state value of the memory cell unit is forgotten;
a second memory configured to store a second cell state value of the memory cell unit, based on the first degree to which the input value is reflected and the second degree to which the first cell state value is forgotten;
a first time gate configured to maintain the first cell state value, and update the first cell state value to be the second cell state value, based on a phase signal;
an output gate configured to determine a third degree to which the first cell state value is output; and
a second time gate configured to, based on the phase signal, maintain an output value of the memory cell unit, and update, based on the first cell state value and the third degree to which the first cell state value is output, the output value.

* * * * *